United States Patent
Martchevskii et al.

(10) Patent No.: US 6,396,261 B1
(45) Date of Patent: May 28, 2002

(54) SCANNING AC HALL MICROSCOPE

(75) Inventors: Maxim Martchevskii, Plainsboro; Mark J. Higgins, Cranbury, both of NJ (US); Sabyasachi Bhattacharya, New York, NY (US)

(73) Assignee: NEC Research Institute, Inc., Princeton, NJ (US)

( * ) Notice: Subject to any disclaimer, the term of this patent is extended or adjusted under 35 U.S.C. 154(b) by 0 days.

(21) Appl. No.: 09/528,689

(22) Filed: Mar. 20, 2000

(51) Int. Cl.$^7$ .............................................. G01R 33/12

(52) U.S. Cl. ....................... 324/235; 324/251; 324/244; 324/233; 324/262

(58) Field of Search ................................. 324/235, 228, 324/234, 244, 248, 251, 260, 233, 292; 338/32 R, 32 H; 505/845; 250/306, 307; 73/719, 721, 725, 727; 310/331

(56) References Cited

PUBLICATIONS

A.M. Chang, et al., "Scanning Hall Probe Microscopy", Applied Physics Letters, 61, (1992), 1974–1976.
A. Oral, et al., "Real–Time Scanning Hall Probe Microscopy", Applied Physics Letters, 69 (1996), 1324–1326.
M. Seul, et al., "Morphology and Local Structure in Labyrinthine Stripe Domain Phase", Science, 254 (1991), 1616–1618.
T. Garel, et al., "Phase Transitions with Spontaneous Modulation–The Dipolar Ising Ferromagnet", Physical Review B, 26 (1982) 325–329.

*Primary Examiner*—Jay Patidar
(74) *Attorney, Agent, or Firm*—Scully, Scott, Murphy & Presser

(57) ABSTRACT

A scanning AC hall microscope and a method which measures the domain pattern of magnetic materials, such as magnetic storage media, by measuring the oscillatory motion of a domain boundary under the influence of an external applied AC magnetic field, which allows a differentiation between domains which are immobile and domains which are mobile.

21 Claims, 2 Drawing Sheets

SCANNING AC HALL MICROSCOPE

BACKGROUND OF THE INVENTION

1. Field of the Invention

The present invention relates generally to a scanning AC hall microscope, and more particularly pertains to a scanning AC hall microscope which measures the domain pattern of magnetic materials by measuring the oscillatory motion of a domain boundary under the influence of an external applied AC magnetic field, which allows a differentiation between domains which are immobile and domains which are mobile.

The last decade has seen an explosion in the types and techniques used in scanning microscopy in general. Among them is the subfield of scanning magnetic microscopy which provides a spatial image of the magnetic properties of a system under study. Four different types of magnetic microscopes are being used currently: SQUID microscopes, magnetic force microscopes, magnetoresistance microscopes and Hall microscopes.

SUMMARY OF THE INVENTION

Accordingly, it is a primary object of the present invention to provide a scanning AC hall microscope.

In accordance with the teachings herein, the present invention provides a scanning AC Hall microscope and a method of operation thereof which measures the domain pattern of magnetic materials by measuring the oscillatory motion of a domain boundary under the influence of an externally applied AC magnetic field, which allows a differentiation between domains which are immobile and domains which are mobile. A steady DC magnetic field $H_0$ and an alternating AC magnetic field $H_{ac}$ are applied to a sample magnetic material, such that the net magnetic field H(t) seen by the sample magnetic material is $$H(t)=H_0+H_{ac}\cos(\omega t)$$

The spatial image of the AC response of the sample magnetic material is detected, by detecting the amplitude of the oscillatory field $B_{ac}$ and the phase difference $\phi$ as the sample is scanned with a Hall sensor.

BRIEF DESCRIPTION OF THE DRAWINGS

The foregoing objects and advantages of the present invention for a scanning AC hall microscope may be more readily understood by one skilled in the art with reference being had to the following detailed description of several preferred embodiments thereof, taken in conjunction with the accompanying drawings wherein like elements are designed by identical reference numerals throughout the several views, and in which:

FIG. 2 shows scanning magnetic images of a garnet film.

DETAILED DESCRIPTION OF THE DRAWINGS

Figure 1:
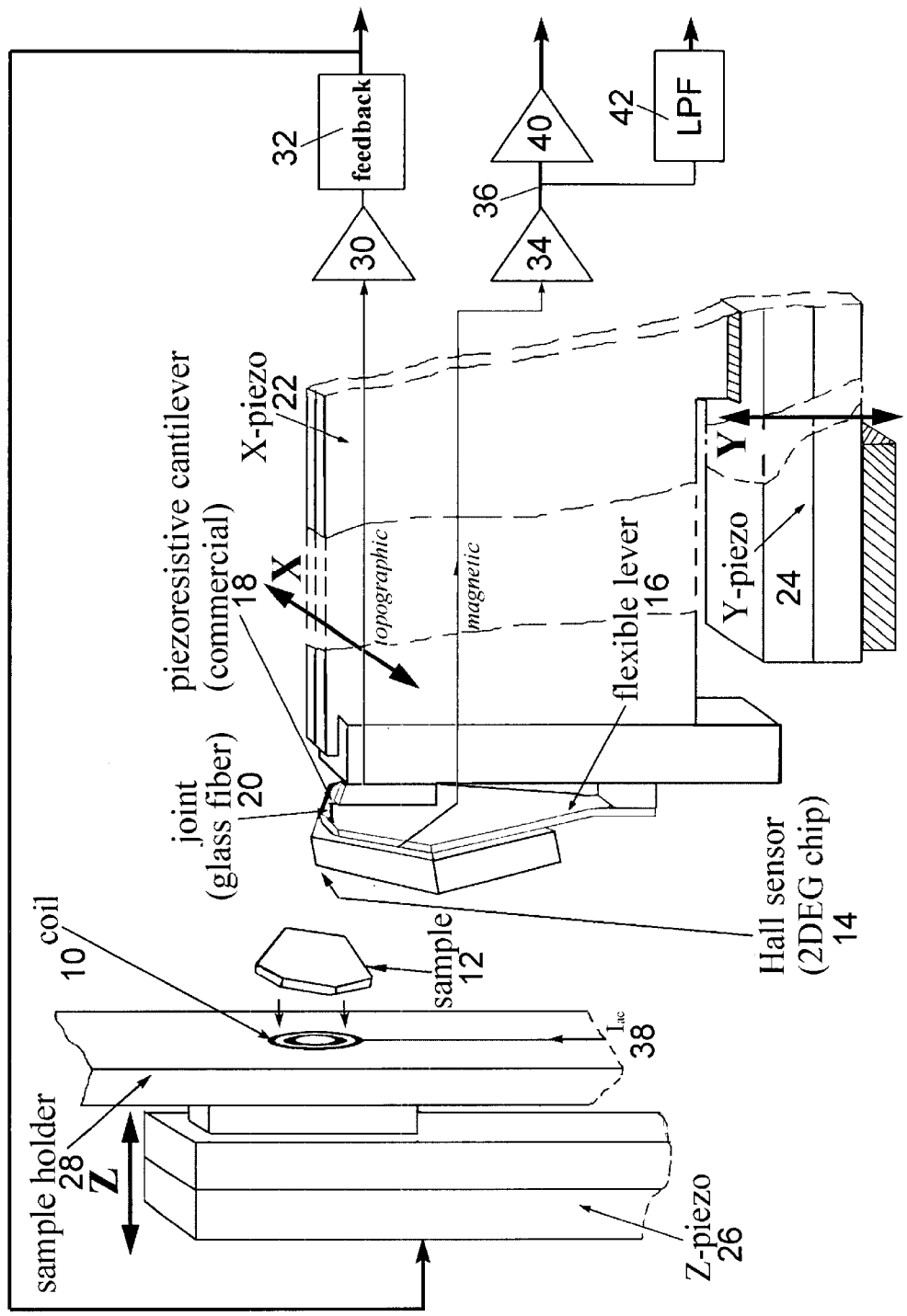
FIG. 1 is a schematic illustration of a scanning AC Hall microscope pursuant to one embodiment of the present invention.

The present invention concerns a scanning AC Hall microscope which allows a measurement of the domain pattern of magnetic materials as is commonly accomplished with a standard scanning Hall microscope. In addition, the present invention uniquely enables a measurement of the oscillatory motion of the domain boundary of magnetic materials under the influence of an externally applied oscillatory AC magnetic field. The spatial image of this AC response allows a differentiation between domains which are immobile and domains which are mobile. By measuring a local phase difference of the moving domains relatively to the driving AC field, AC dissipation can be mapped in the magnetic material on a microscopic scale. Since pinning and non-dissipative switching of magnetic domains are crucial to storage media and AC magnetic device applications, the present invention provides an advance in the diagnostic studies of magnetic materials.

The technique is based upon the Hall effect of materials. Pursuant thereto when a material is placed in a magnetic field along the z-axis and an electric current is directed along the x-axis, the material develops a transverse voltage along the y-axis, known as the Hall voltage. It measures the transverse drift of the electrons in a magnetic field, which is balanced by this voltage in steady-state. The Hall voltage $E_y$ is given by:

$$E_y = J \times B.(1/ne) \quad (1)$$

where e is the charge of the carriers (electrons or holes) and n is their density; the Hall coefficient is $R_H=1/ne$. Thus the Hall voltage is a measure of the field seen by the carriers. In practice, the scanning object is a semi-metal or a semiconductor with a large value of $R_H$. It is scanned over a spatial region and thus yields a spatial map of the observed local magnetic field. There are many realizations of the Hall microscope that have been reported in the literature [A. M. Chang et al., Applied Physics Letters, 61, 1974 (1992), A. Oral et al., Applied Physics Letters, 69 1324 (1996)].

The standard magnetic microscopy images provide a spatial magnetic field map. When one scans a magnet, it provides a map of local magnetic polarity, say, N-pole and S-pole in space. For many magnets, the sample is divided into domains of N-poles separated from domains of S-poles with domain walls separating them. The standard scanned images provide a static picture of these domains averaged over the scanning time. If the domains are mobile and move during the scan, the images are naturally blurred by the movement. These pictures provide no information of which domains are mobile and which are not mobile. However, a key question on the usefulness of magnetic storage media is the switchability of the domains on which data are to be stored. Thus, one needs to know how easy or difficult it is to switch the domains from say, N-pole to S-pole or vice versa. The microscope of the present invention provides a contrast map of immobile (strongly pinned) domains versus mobile (weakly pinned) domains. Thus this technique provides a new and extremely useful tool in diagnostic evaluation of, e.g., the usefulness of magnetic storage media.

FIG. 1 illustrates a scanning AC Hall microscope in which a metallic coil 10 is attached to the microscope stage, on top of which coil 10 a sample 12 to be studied is placed. In addition to a steady DC magnetic field $H_0$ which is normally applied by a solenoid in a Hall microscope, pursuant to the present invention an alternating (AC) magnetic field $H_{ac}$ is also applied by directing an alternating current through the coil 10. The net field H(t) is thus:

$$H(t)=H_0+H_{ac}\cos(\omega t) \quad (2)$$

The magnetic induction seen by a Hall bar sensor 12 positioned on the opposite side of the sample 12 incorporates the magnetic response of the sample through its magnetic susceptibility through the relation:

$$B = H(1 + 4\pi\chi) \quad (3)$$

$\chi$ is a dimensionless parameter defined as $\chi = M/H$, where M is the magnetic moment per unit volume and B is the macroscopic magnetic field intensity.

And the net induction is given by:

$$B(t) = B_0 + B_{ac}\cos(\omega t + \phi) \quad (4)$$

As shown above in equation (1), this would yield a local Hall voltage proportional to B (t).

The instrument detects three quantities (1) the steady field $B_0$, (2) the amplitude of the oscillatory field $B_{ac}$, and (3) the phase difference $\phi$ as the sample is scanned. The latter two plots can be detected by lock-in amplifiers using standard phase-sensitive detection circuitry which is added to the standard electronics, and are novel aspects of the instrument of the present invention.

FIG. 1 shows the design of a scanning AC Hall microscope pursuant to the present invention. The instrument is divided into several subsections:

(1) Hall sensor/piezo-cantilever assembly
(2) Scanning parts (XYZ piezo's)
(3) Sample stage
(4) AC magnetic field coil
(5) electronic detection system for
   (a) standard microscopy
   (b) scanning AC susceptometry The central part of the apparatus is a 2DEG (2 dimensional electron gas) Hall sensor 14 with an active area of 1 $\mu$m, prepared by photolithography. The Hall sensor 14 is mounted on a flexible titanium lever 16, which is deflected when the corner of the Hall-bar chip 14 comes into contact with the sample 12. A piezoresistive cantilever 18 is a commercially available device which is linked to the Hall sensor 14 by a mechanical glass fiber joint 20, and the cantilever 18 resistance therefore will change in response to the deflection of the titanium lever 16. This assembly allows one to detect the displacement of the Hall bar chip 14 due to its contact with the sample 12.

Also, while in a contact mode, the topography of the sample 12 can be measured by scanning the corner of the Hall bar chip 14 simultaneously with imaging of the magnetic field distribution by the Hall sensor 14. The Hall bar-cantilever assembly 14,16,18,20 is mounted on a bimorph plate based piezoscanner, comprised of an x-piezoscanner 22 and a y-piezoscanner 24, which provide two dimensional (2D) translation in the range of approximately 150 $\mu$m. A Z-piezo-translator 26 with a sample holder 28 are mounted opposite to the x-y scanner 22,24. The small copper coil 10 is attached to the sample holder, and the sample 12 is mounted on top of the sample holder 28. Prior to mounting of the sample 12, the coil 10 is positioned such that its center is aligned with the Hall sensor 14 along the z-axis.

An initial "coarse" approach of the sample 12 to the Hall sensor 14 can be achieved by a mechanical screw (not shown in the Figure). Subsequently, a further "fine" approach can be performed by applying a voltage to the bimorph piezo-plate Z-translator 26. Contact between the Hall bar chip 14 and the sample 12 is detected by monitoring the resistance change of the piezo-cantilever 18. Next, the scanning plane is aligned with the surface of the sample 12. This is accomplished by adding a compensation voltage proportional to the scanner voltage to the Z-piezo 26 while monitoring the piezo-lever 18 resistance. After the alignment is performed, an electronic feedback system 30,32 is turned on to keep the deflection of the piezo-lever 16,18 constant during the scan, in the same manner as for topographic imaging in a conventional Atomic Force Microscope (AFM). In this mode, both topographic (feedback signal through 30,32) and magnetic information at 36 can be obtained simultaneously. Alternatively, one can avoid the use of a feedback by withdrawing the Hall sensor for about 0.1 $\mu$m from the sample surface and scanning parallel to the sample surface in a non-contact mode; in this case only the magnetic information at 36 is collected. The latter mode prolongs the useful life of the Hall bar chip 14. In both modes of operation, an AC current 38 is applied to the coil 10 underneath the sample 12 to modulate the DC magnetic field produced by an external solenoid.

The Hall sensor 14 is driven by a DC current of 2–5 $\mu$A. The voltage signal is first amplified by a preamplifier 34 with a gain $10^4$, and is then split between a lock-in amplifier 40 (AC signal) and a low pass filter 42 with a cutoff below the modulation frequency.

The instrument as described has the following characteristics.

Lateral resolution 1 $\mu$m
Temperature range: 300–5 K
Scanning range:
~200×200 $\mu$m (at 300 K)
~50×50 $\mu$m (at 5 K)
Field resolution (DC field):
~1 G (at 300 K)
~50 mG (at 5 K)

Figures 2A, 2B, 2C:
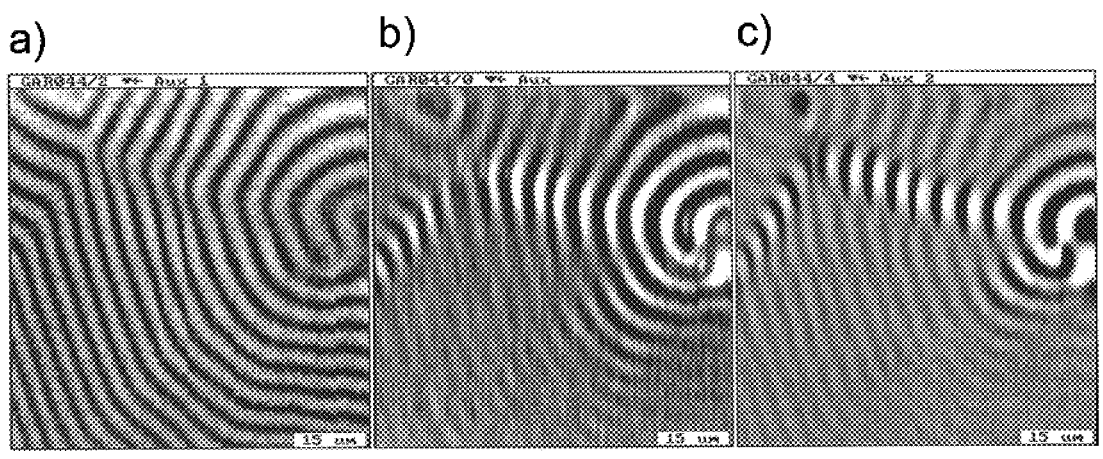
FIG.2a shows (a) the conventional DC magnetic field image.
FIGS. 2b and 2c are respectively (b) amplitude and (c) phase maps providing the AC magnetic field image in which the bright regions correspond to the regions of large vibrations, and represent novel measurements of the present invention.

To demonstrate the performance of the apparatus, both AC and DC Hall images were measured on a garnet film. The "labyrinthine" pattern of such systems has been reported in literature [M. Seul, Science, Volume 254, pp 1616 (1991)] and some general theoretical understanding is also available [T. Garel and S. Doniach, Physical Review B 26, 325 (1982)]. The magnetic domain structure of the film is clearly seen in the DC Hall image of FIG. 2a; the bright and dark regions are the domains of opposite polarity and the magnetization vector is normal to the film surface. An AC modulation at frequency of f=777 Hz was applied while scanning and the resulting images of the AC amplitude and phase transmitted through the sample are shown in FIG. 2b and 2c, respectively. First, one can clearly see the difference between the AC and DC Hall images. In the AC amplitude image only those domain boundaries that move laterally with the applied modulation field become visible, thereby providing a signal that changes in both amplitude and phase as the spatial scanning is performed. The bright regions correspond to large amplitude vibrations, while the dark regions indicate strongly pinned domains. Moreover, one sees the well-defined structure of the domain wall excitations that are preferentially localized between the topological defects ("branching" and "end" points) in the domain structure. An even clearer contrast is seen in the phase image (FIG. 2c) where all the topological defects show up as bright points as well as the phase difference in motion of the individual domain boundaries is observed. Thus the present invention uniquely provides scanning microscope detection of the vibrating domain walls.

If the magnetic material is ready to switch, i.e., not strongly pinned, then it will oscillate under the AC field, and this is manifested in a large AC Hall resistance. The non-switchable region will not oscillate much and will thus provide a small AC Hall resistance. The contrast of the AC Hall resistance thus provides a spatial map of switchable and nonswitchable regions. In addition this method provides a very useful tool for magnetic inhomogeneity of a system in general.

The technique has several distinct advantages. First, the detection technique is non-invasive, i.e. the detection system itself does not interfere with the state of the system to be studied, in contrast with magnetic force microscopy. Second, it provides an absolute scale calibration. Third, although it is not as sensitive as a SQUID microscope, it operates easily at room temperature, which the SQUID cannot. Fourth, the spatial resolution of the microscope is better than the best available SQUID microscope. Moreover, it is believed that spatial resolution could be improved to the state of the art, and with some effort reduced by another order of magnitude.

While several embodiments and variations of the present invention for a scanning AC hall microscope are described in detail herein, it should be apparent that the disclosure and teachings of the present invention will suggest many alternative designs to those skilled in the art.

What is claimed is:

1. A scanning AC Hall microscope which measures the domain pattern of magnetic materials by measuring the oscillatory motion of a domain boundary under the influence of an externally applied AC magnetic field, which allows a differentiation between domains which are immobile and domains which are mobile, comprising:

a. means for applying a steady DC magnetic field $H_0$ to a sample magnetic material;

b. means for additionally applying an alternating AC magnetic field $H_{ac}$ to the sample magnetic material, such that the net magnetic field $H(t)$ seen by the sample magnetic material is $$H(t)=H_0+H_{ac}\cos(\omega t);$$

c. means for detecting the spatial image of the AC response of the sample magnetic material as the sample is scanned with a Hall sensor.

2. A scanning AC Hall microscope as claimed in claim 1, including means for detecting the amplitude of the oscillatory field $B_{ac}$ and the phase difference $\phi$ as the sample is scanned.

3. A scanning AC Hall microscope as claimed in claim 1, wherein the detecting means includes lock-in amplifiers using phase-sensitive detection circuitry.

4. A scanning AC Hall microscope as claimed in claim 1, wherein the Hall sensor is mounted on an opposite side of the sample and the magnetic induction seen by the Hall sensor incorporates the magnetic response of the sample through its magnetic susceptibility through the relation $$B=H(1+4\pi\chi),$$

and the net induction is given by $$B(t)=B_0+B_{ac}\cos(\omega t+\phi),$$

where $\chi$ is a dimensionless parameter defined as $\chi=M/H$, where M is the magnetic moment per unit volume and B is the macroscopic magnetic field intensity, and $B_0$ is the steady field.

5. A scanning AC Hall microscope as claimed in claim 1, wherein the detecting means measures a local phase difference of moving domains relative to the driving AC field to map AC dissipation in the magnetic material on a microscope scale.

6. A scanning AC Hall microscope as claimed in claim 1, wherein the sample magnetic material is placed on top of a metallic coil attached to a microscope stage of the AC Hall microscope, and the alternating (AC) magnetic field is applied by directing an alternating current (AC) through the coil.

7. A scanning AC Hall microscope as claimed in claim 1, wherein the Hall sensor is mounted on a flexible lever by a piezoresistive cantilever which is linked to the Hall sensor, and the resistance of the piezoresistive cantilever changes in response to deflection of the flexible lever when the Hall sensor contacts the sample.

8. A scanning AC Hall microscope as claimed in claim 7, wherein while in a contact mode, the topography of the sample is measured by scanning the Hall sensor simultaneously with imaging of the magnetic field distribution by the Hall sensor.

9. A scanning AC Hall microscope as claimed in claim 8, wherein the Hall sensor and cantilever assembly are mounted on a bimorph plate based x and y piezoscanner which provides two dimensional translation, and a Z-piezo translator with a sample holder is mounted opposite to the scanner, the coil is attached to the holder, the sample is mounted on the holder, and the coil is positioned such that its center is aligned with the Hall sensor along the z-axis.

10. A scanning AC Hall microscope as claimed in claim 9, wherein an approach of the sample to the Hall sensor is achieved by applying a voltage to the Z-piezo translator, and contact between the Hall sensor and the sample is detected by monitoring the resistance change of the piezoresistive cantilever, a scanning plane is aligned with the sample surface by adding a compensation voltage proportional to the scanner voltage to the Z-piezo translator while monitoring the piezoresistive cantilever resistance, and after the alignment is finished, an electronic feedback system maintains the deflection of the piezoresistive cantilever constant during the scan, and in this mode both topographic data in the feedback signal and also magnetic information are obtained simultaneously.

11. A method of operating a scanning AC Hall microscope which measures the domain pattern of magnetic materials by measuring the oscillatory motion of a domain boundary under the influence of an externally applied AC magnetic field, which allows a differentiation between domains which are immobile and domains which are mobile, comprising:

a. applying a steady DC magnetic field $H_0$ to a sample magnetic material;

b. additionally applying alternating AC magnetic field $H_{ac}$ to the sample magnetic material, such that the net magnetic field $H(t)$ seen by the sample magnetic material is $$H(t)=H_0+H_{ac}\cos(\omega t)$$

c. detecting the spatial image of the AC response of the sample magnetic material as the sample is scanned with a Hall sensor.

12. A method as claimed in claim 11, including detecting the amplitude of the oscillatory field $B_{ac}$ and the phase difference $\phi$ as the sample is scanned.

13. A method as claimed in claim 11, wherein the detecting step is performed by lock-in amplifiers using phase-sensitive detection circuitry.

14. A method as claimed in claim 11, wherein the detecting step detects magnetic induction seen by the Hall sensor on an opposite side of the sample which incorporates the magnetic response of the sample through its magnetic susceptibility through the relation $$B=H(1+4\pi\chi),$$

and the net induction is given by $$B(t)=B_0+B_{ac}\cos(\omega t+\phi),$$

where $\chi$ is a dimensionless parameter defined as $\chi=M/H$, where M is the magnetic moment per unit volume and B is the macroscopic magnetic field intensity, and $B_0$ is the steady field.

15. A method as claimed in claim 11, wherein the magnetic sample is divided into domains of N-poles separated from domains of S-poles by domain walls, and the detecting step provides a contrast map of immobile (strongly pinned) domains versus mobile (weakly pinned) domains, which indicate how easy or difficult it is to switch the domains from N-pole to S-pole or vice versa.

16. A method as claimed in claim 11, wherein the detecting step measures a local phase difference of moving domains relative to the driving AC field to map AC dissipation in the magnetic material on a microscope scale.

17. A method as claimed in claim 11, wherein the sample magnetic material is placed on top of a metallic coil attached to a microscope stage of the AC Hall microscope, and the alternating (AC) magnetic field is applied by directing an alternating current (AC) through the coil.

18. A method as claimed in claim 17, wherein the Hall sensor is mounted on a flexible lever by a piezoresistive cantilever which is linked to the Hall sensor, and the resistance of the piezoresistive cantilever changes in response to deflection of the flexible lever when the Hall sensor contacts the sample.

19. A method as claimed in claim 18, wherein while in a contact mode, the topography of the sample is measured by scanning the Hall sensor simultaneously with imaging of the magnetic field distribution by the Hall sensor.

20. A method as claimed in claim 18, wherein the Hall sensor and cantilever assembly are mounted on a bimorph plate based x and y piezoscanner which provides two dimensional translation, and a Z-piezo translator with a sample holder is mounted opposite to the scanner, the coil is attached to the holder, the sample is mounted on the holder, and the coil is positioned such that its center is aligned with the Hall sensor along the z-axis.

21. A method as claimed in claim 20, wherein an approach of the sample to the Hall sensor is achieved by applying a voltage to the Z-piezo translator, and contact between the Hall sensor and the sample is detected by monitoring the resistance change of the piezoresistive cantilever, a scanning plane is aligned with the sample surface by adding a compensation voltage proportional to the scanner voltage to the Z-piezo translator while monitoring the piezoresistive cantilever resistance, and after the alignment is finished, an electronic feedback system maintains the deflection of the piezoresistive cantilever constant during the scan, and in this mode both topographic data in the feedback signal and also magnetic information are obtained simultaneously.

* * * * *